United States Patent
Tsuji et al.

(10) Patent No.: US 7,940,828 B2
(45) Date of Patent: May 10, 2011

(54) OPTICAL COMMUNICATION SYSTEM AND OPTICAL TRANSMITTER

(75) Inventors: Masayoshi Tsuji, Tokyo (JP); Hiroshi Hatakeyama, Tokyo (JP); Kimiyoshi Fukatsu, Tokyo (JP); Takayoshi Anan, Tokyo (JP); Naofumi Suzuki, Tokyo (JP); Kenichiro Yashiki, Tokyo (JP)

(73) Assignee: NEC Corporation, Tokyo (JP)

( * ) Notice: Subject to any disclaimer, the term of this patent is extended or adjusted under 35 U.S.C. 154(b) by 342 days.

(21) Appl. No.: 12/279,399

(22) PCT Filed: Dec. 27, 2006

(86) PCT No.: PCT/JP2006/326107
§ 371 (c)(1),
(2), (4) Date: Aug. 14, 2008

(87) PCT Pub. No.: WO2007/097110
PCT Pub. Date: Aug. 30, 2007

(65) Prior Publication Data
US 2009/0028201 A1 Jan. 29, 2009

(30) Foreign Application Priority Data
Feb. 24, 2006 (JP) ................................. 2006-049238

(51) Int. Cl.
*H01S 5/00* (2006.01)
(52) U.S. Cl. .............. 372/50.12; 372/50.124; 372/50.21
(58) Field of Classification Search .............. 372/50.12, 372/121, 124, 21, 50.121, 50.124, 50.21
See application file for complete search history.

(56) References Cited

U.S. PATENT DOCUMENTS

| | | | | |
|---|---|---|---|---|
| 6,363,194 B1 * | 3/2002 | DiGiovanni et al. | ......... | 385/123 |
| 2006/0097245 A1 * | 5/2006 | Aanegola et al. | ................ | 257/26 |
| 2009/0269064 A1 * | 10/2009 | Joseph et al. | ................... | 398/78 |

FOREIGN PATENT DOCUMENTS

| | | |
|---|---|---|
| JP | 08-125257 | 5/1996 |
| JP | 10-233559 | 9/1998 |
| JP | 2002-094180 | 3/2002 |
| JP | 2003-179315 | 6/2003 |
| JP | 2003-195125 | 7/2003 |
| JP | 2003-195125 * | 9/2003 |
| JP | 2004-327862 | 11/2004 |

(Continued)

OTHER PUBLICATIONS

Bobs M. Hawkins et al, Reliability of Various Size Oxide Aperture VCSELs, Honeywell International, 830 E. Arapaho Road, Richardson, Texas 75081, bobby.hawkins@honeywell.com, pp. 1-11.

(Continued)

*Primary Examiner* — Armando Rodriguez
(74) *Attorney, Agent, or Firm* — Young & Thompson (57) ABSTRACT

An optical communication system for performing data transmission with optical signals comprises a first optical transmitter and a first optical receiver. The first optical transmitter has a first surface-emitting laser including an active layer of a multiple quantum well structure having a quantum well layer of $In_xGa_{1-x}As$ ($0.15 \leqq x \leqq 0.35$), the first surface-emitting laser having an oscillation wavelength ranging from 1000 nm to 1100 nm inclusive. The first optical transmitter transmits an optical signal generated by the first surface-emitting laser. The first optical receiver is connected to the first optical transmitter by a first optical transfer path, and receives the optical signal transmitted from the first optical transmitter through the first optical transfer path.

9 Claims, 9 Drawing Sheets

FOREIGN PATENT DOCUMENTS

| | | |
|---|---|---|
| JP | 2005-340567 | 12/2005 |
| JP | 2006-019679 | 1/2006 |
| JP | 2006-049428 | 2/2006 |
| WO | 2004/109959 | 12/2004 |

OTHER PUBLICATIONS

David T. Mathes et al, Nanoscale Materials Characterization of Degradation in VCSELs, VCSEL Optical products, Honeywell Inc., 830 E. Arapaho Rd., Richardson, TX 75081; Dept. of Materials Science and Engineering, University of Virginia, 116 Engineer's Way, Charlottesville, VA 22904; Dept. of Electrical Engineering, University of Illinois at Urbana-Champaign, 208 North Wright St., Urbana, IL 61801; Center for Compound Semiconductor Science and Technology, Sandia National Labs, P.O. Box 5800 MS-0603 Albuquerque, NM 87185, Vertical-Cavity Surface-Emitting.

R.G. Waters, D.P. Bour et al, Inhibited Dark-Line Defect Formation in Strained INGaAs/AIGaAs Quantum Well Lasers, IEEE Photonics Technology Letters, vol. 2, No. 8, Aug. 1990, pp. 1-3.

T. Miyazaki et al., Neodymium-doped fibre amplifier at 1.064 u.m, Electronics Letters 8th Dec. 1994, vol. 30 No. 25, pp. 2142-2143.

International Search Report dated Apr. 10, 2007, in PCT Application.

* cited by examiner

OPTICAL COMMUNICATION SYSTEM AND OPTICAL TRANSMITTER

TECHNICAL FIELD

The present invention relates to an optical communication system for interconnecting electronic devices.

BACKGROUND ART

In recent years, optical communication systems for optically interconnecting electronic devices such as computers, etc. and transferring information have been installed in offices, homes, etc.

Surface-emitting lasers are used as the light sources of such optical communication systems. A surface-emitting laser in a band of 850 nm has already been put to practical use for Ethernet (registered trademark) as high-speed LAN technologies (see JP-A No. 2005-093704).

DISCLOSURE OF THE INVENTION

When optical communication systems are installed in offices, homes, etc., they are required to be durable in temperature environments ranging from about 0° C. to 100° C. because the environmental temperature is difficult to manage strictly.

However, surface-emitting lasers in an oscillation wavelength band of 850 nm which are incorporated in optical communication systems according to the background art are of poor durability in temperature environments ranging from about 0° C. to 100° C.

Consequently, it has been difficult to increase the reliability of optical communication systems which incorporate surface-emitting lasers having an oscillation wavelength band of 850 nm.

It is an object of the present invention to provide a vehicle-mounted optical communication system which is highly reliable.

To achieve the above object, an optical communication system according to the present invention for performing data transmission with optical signals, comprises a first optical transmitter and a first optical receiver.

The first optical transmitter has a first surface-emitting laser including an active layer of a multiple quantum well structure having a quantum well layer of $In_xGa_{1-x}As$ ($0.15 \leq x \leq 0.35$), the first surface-emitting laser having an oscillation wavelength ranging from 1000 nm to 1100 nm inclusive.

The first optical transmitter and the first optical receiver are connected to each other by a first optical transfer path. The first optical transmitter transmits an optical signal generated by the first surface-emitting laser. The first optical receiver receives the optical signal transmitted from the first optical transmitter through the first optical transfer path.

BEST MODE FOR CARRYING OUT THE INVENTION

Exemplary embodiments of the present invention will be described in detail below with reference to the drawings.

The inventors of the present invention have considered that the durability of a surface-emitting laser in severe environments is lowered by the growth of crystalline defects in an active layer due to a temperature rise.

The inventors have considered that it is important to suppress the growth of crystalline defects in the active layer of the surface-emitting laser in order to provide an optical communication system which is highly reliable in severe environments.

It has been realized that crystalline defects are easy to grow in surface-emitting lasers having an oscillation wavelength band of 850 nm according to the background art because the active layer thereof generally comprises a quantum well layer of GaAs and a barrier layer of AlGaAs. In particular, if the environmental temperature rises or the current density rises, then crystalline defects grow significantly, and the service life of surface-emitting lasers decreases significantly.

Figure 1:
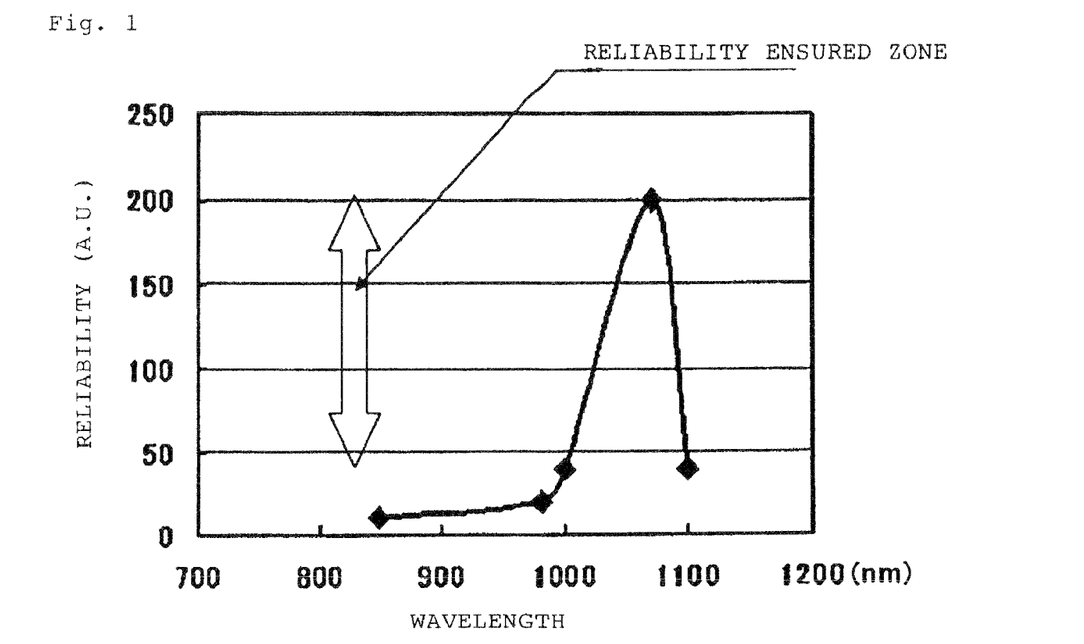
FIG. 1 is a diagram showing the relationship between the oscillation wavelengths of surface-emitting lasers and the reliability thereof.

The inventors have studied the relationship between the growth of crystalline defects and the oscillation wavelength (the proportion of In in an $In_xGa_{1-x}As$ layer as a quantum well layer), and reached the conclusion shown in FIG. 1.

The inventors have found that as shown in FIG. 1, the reliability of a surface-emitting laser is greatly improved by increasing the proportion of In into the range of $0.15 \leq x \leq 0.35$ and keeping the oscillation wavelength in the range from 1000 nm to 1100 nm inclusive. FIG. 1 shows simulated times required until the intensity of light drops 20% when a current of given value passes through surface-emitting lasers having respective proportions of In (oscillation wavelengths). The reliability represented by the vertical axis shows relative values of the times required until the intensity of light drops 20%. The proportion of In in the quantum well layer of the surface-emitting layer having an oscillation wavelength band of 850 nm is nil. In FIG. 1, the values of reliability represented by the vertical axis are required to be 48 or greater.

In an oscillation wavelength range from 1000 nm to 1100 nm inclusive, the added In is considered to pin and reduce the growth of crystalline defects. In addition, the high differential gain of InGaAs itself is considered to greatly reduce the amount of drive current for the surface-emitting laser, thereby preventing the temperature in the active layer of the surface-emitting laser from rising for greatly increased reliability.

FIG. 1 is plotted when the environmental temperature is 100° C. and the transmission rate is 1 Gbps.

Optical communication systems according to exemplary embodiments of the present invention comprise an optical transmitter having a light source device, a transfer medium for transferring light from the optical transmitter, and an optical receiver for receiving the light transferred by the transfer medium, and are installed indoors. The optical communication systems serve to transfer data at a high rate of 1 Gbps or higher. The light source device comprises a surface-emitting layer having a GaAs substrate and an active layer disposed on the GaAs substrate. The active layer is of a multiple quantum well structure having a quantum well layer of $In_xGa_{1-x}As$ ($0.15 \leq x \leq 0.35$), and the surface-emitting laser has an oscillation wavelength ranging from 1000 nm to 1100 nm inclusive.

With the above arrangement, the active layer of the surface-emitting laser has a quantum well layer of $In_xGa_{1-x}As$ ($0.15 \leq x \leq 0.35$) and the surface-emitting laser has an oscillation wavelength ranging from 1000 nm to 1100 nm inclusive. The surface-emitting laser is highly reliable in severe temperature environments. The optical communication system that is installed indoors which incorporates the surface-emitting laser is highly reliable.

There is known a surface-emitting laser with an active layer having a quantum well layer of $In_{0.2}Ga_{0.8}As$ as disclosed in JP-A No. 10-233559. However, it has heretofore not been known at all to increase durability against environmental temperatures for high reliability in severe temperature environments by keeping the proportion of In in a quantum well layer of $In_xGa_{1-x}As$ in the range of $0.15 \leq x \leq 0.35$ and keeping the oscillation wavelength in the range from 1000 nm to 1100 nm inclusive. In other words, it has heretofore not been anticipated to be able to provide a highly reliable optical communication system to be installed indoors by incorporating therein a surface-emitting laser having a quantum well layer of $In_xGa_{1-x}As$ ($0.15 \leq x \leq 0.35$) and an oscillation wavelength ranging from 1000 nm to 1100 nm inclusive.

Exemplary embodiments of the present invention will be described in detail below with reference to the drawings. Similar components are denoted by similar reference characters throughout views and will not be described below.

1st Exemplary Embodiment

Figure 2:
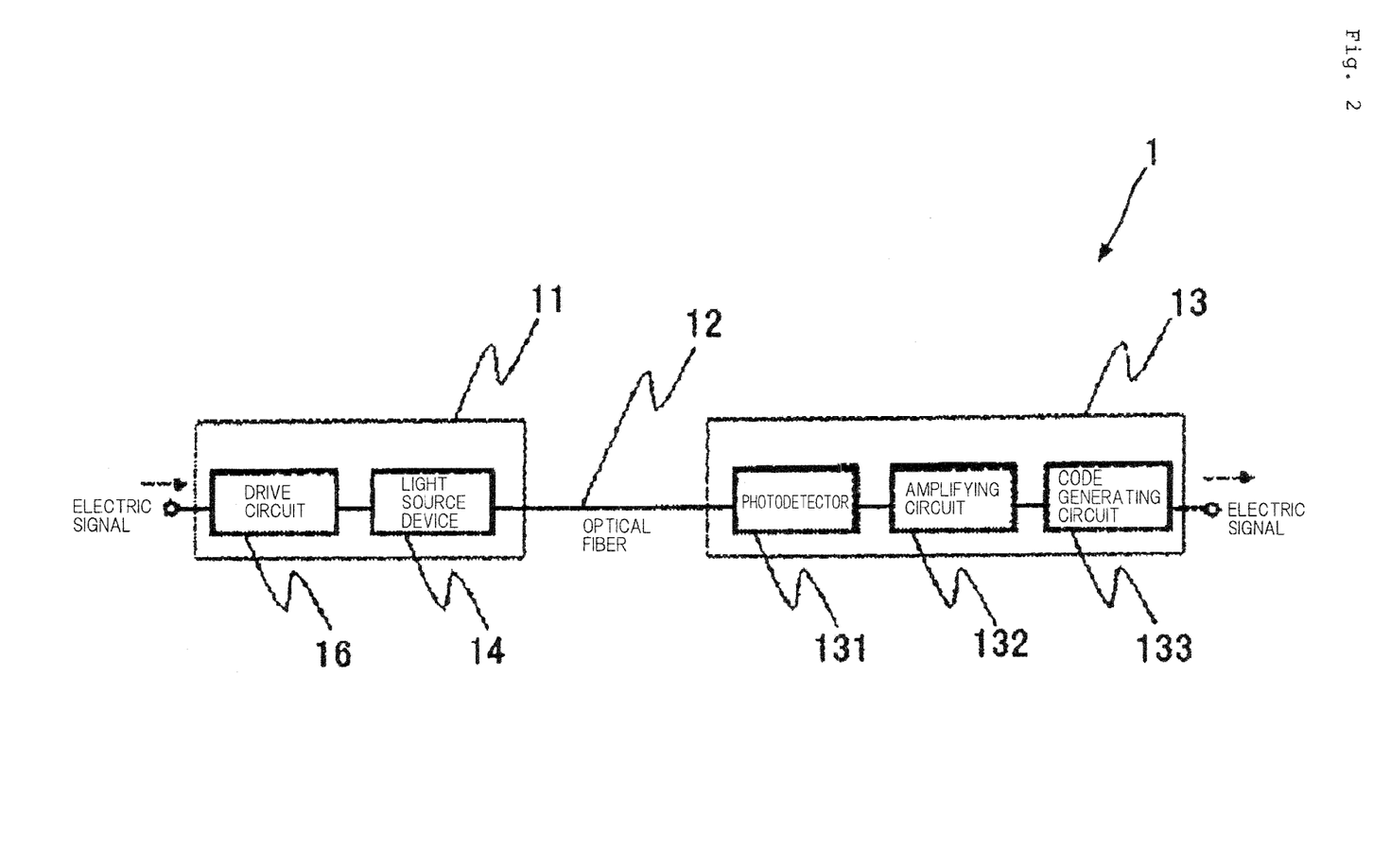
FIG. 2 is a diagram showing an optical communication system according to a first exemplary embodiment of the present invention.

Optical communication system 1 shown in FIG. 2 comprises optical transmitter 11 having light source device 14, transfer medium 12 for transferring light from optical transmitter 11, and optical receiver 13 for receiving the light transferred by transfer medium 12. The optical communication system serves to transfer data at a high rate of 1 Gbps or higher.

Optical communication system 1 is used at home or office, and is installed in buildings or the like.

Figure 3:
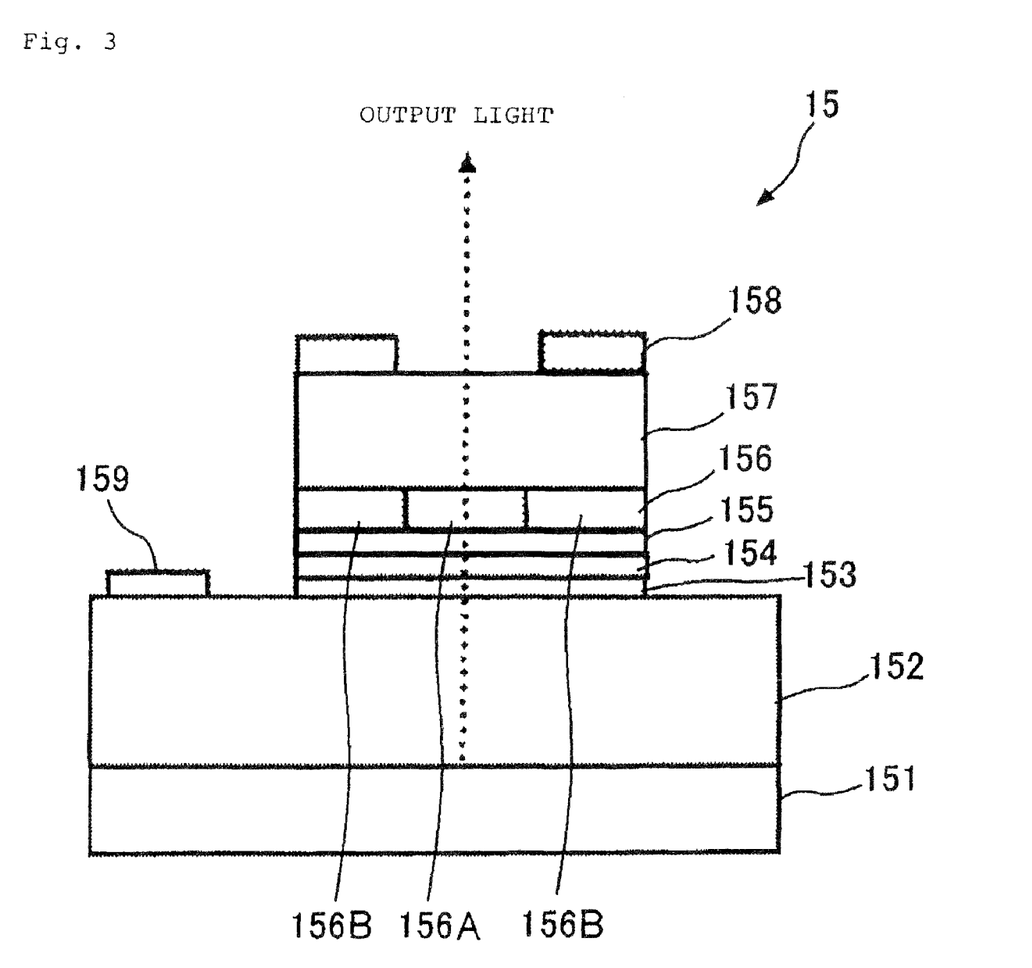
FIG. 3 is a cross-sectional view of a surface-emitting laser.

As shown in FIG. 3, light source device 14 comprises surface-emitting laser 15 including GaAs substrate 151 and active layer 154 disposed on GaAs substrate 151. Active layer 154 is of a multiple quantum well structure having a quantum well layer of $In_xGa_{1-x}As$ ($0.15 \leq x \leq 0.35$). Surface-emitting laser 15 has an oscillation wavelength ranging from 1000 nm to 1100 nm inclusive.

Details of optical communication system 1 will be descried in detail below.

Optical transmitter 11 is incorporated in a video-on-demand relay device. An electric signal based on an image is supplied to optical transmitter 11.

Optical transmitter 11 comprises light source device 14 and drive circuit 16 for energizing light source device 14. Drive circuit 16 is supplied with an electric signal based on an image acquired by the video-on-demand relay device, and modulates light emitted by surface-emitting laser 15 of light source device 14 with the electric signal.

As shown in FIG. 3, surface-emitting laser 15 comprises GaAs substrate 151 as a semiconductor substrate, first DBR (Distributed Bragg Reflector) layer 152 disposed on GaAs substrate 151, cladding layer 153 disposed on first DBR layer 152, active layer 154 disposed on cladding layer 153, second cladding layer 155 disposed on active layer 154, current constricting layer 156 disposed on second cladding layer 155, and second DBR (Distributed Bragg Reflector) layer 157 disposed on current constricting layer 156.

Surface-emitting laser 15 is of the vertical resonator type.

First DBR layer 152 is an n-type semiconductor multilayer film comprising an alternate stack of n-type AlGaAs films and n-type GaAs films.

Cladding layer 153 comprises a GaAs layer, for example.

Active layer 154 is an MQW (Multiple Quantum Well) layer comprising an alternate stack of quantum well layers of $In_xGa_{1-x}As$ ($0.15 \leq x \leq 0.35$) and GaAs barrier layers. In the present exemplary embodiment, the quantum well layers comprise an $In_{0.25}Ga_{0.75}As$ layer, and surface-emitting laser 15 has an oscillation wavelength of 1070 nm.

Second cladding layer 155 comprises a GaAs layer, for example.

Current constricting layer 156 comprises an AlAs layer. Current constricting layer 156 includes low-resistance region 156A. Low-resistance region 156A is sandwiched between high-resistance regions (oxide regions) 156B having a higher resistance value than low-resistance region 156A and formed by a steam oxidation process.

Second DBR layer 157 is a p-type semiconductor multilayer film comprising an alternate stack of p-type AlGaAs films and p-type GaAs films.

Upper electrode 158 is disposed on second DBR layer 157, and lower electrode 159 is disposed on first DBR layer 152.

Surface-emitting laser 15 is produced by successively growing layers 152 through 157 on GaAs substrate 151 by MOVPE (Metal-Organic Vapor Phase Epitaxy), gas source MBE (Molecular Beam Epitaxy), or the like.

Figure 4:
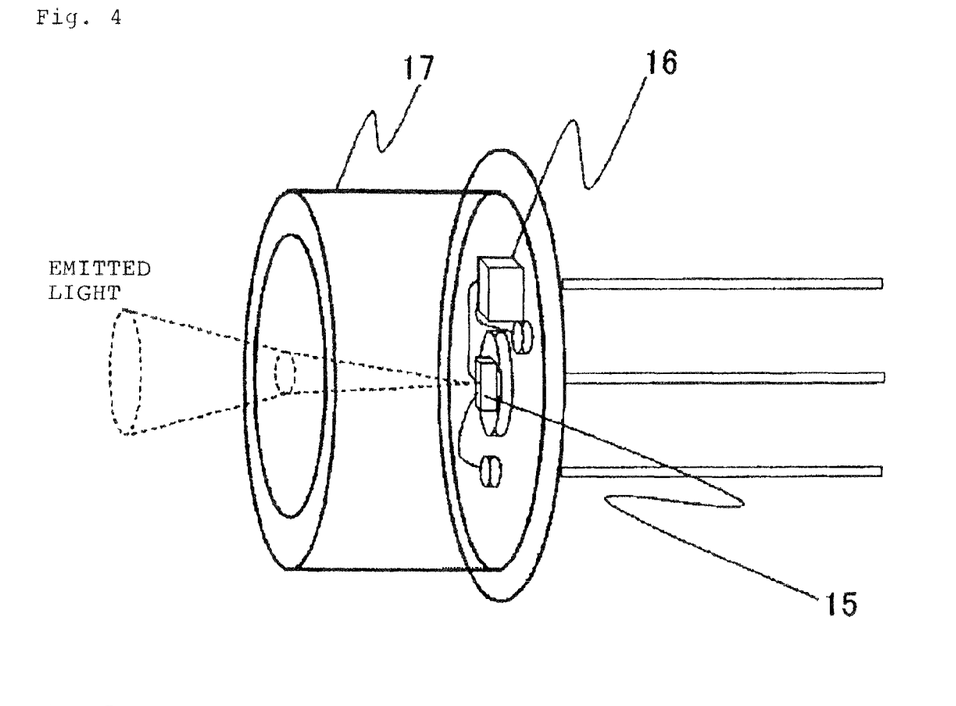
FIG. 4 is a perspective view of a package.

Surface-emitting laser 15 of light source device 14 and drive circuit 16 are sealed in package 17 as shown in FIG. 4. Package 17 is made of plastics or metal and is of a hollow cylindrical shape. Surface-emitting laser 15 and drive circuit 16 are fixedly mounted on the bottom surface of package 17. Package 17 is filled with an electrically insulative liquid or gel (e.g., silicone-base liquid or gel).

Vehicle-mounted optical communication system 1 will be described below with reference to FIG. 2 again.

Transfer medium 12 serves to transfer an optical signal from surface-emitting laser 15 of light source device 14, and comprises, for example, an optical fiber such as a polymer-clad optical fiber (PCF) or the like.

Optical receiver 13 serves to receive the optical signal from transfer medium 12, and comprises photodetector 131, amplifying circuit 132, and code generating circuit 133.

Photodetector 131 may be any photodetector insofar as it can detect light in a wavelength range from 1000 nm to 1100 nm, emitted from surface-emitting laser 15.

Photodetector 131 converts the optical signal into an electric signal, which is decoded as it is processed by amplifying circuit 132 and code generating circuit 133.

Optical receiver 13 is incorporated in a TV set or the like installed in a room. The electric signal decoded by optical receiver 13 is displayed as an image on the TV device.

When the transfer medium 12 of optical communication system 1 was in the form of a polymer-clad optical fiber (PCF) having a length of 10 m, the transmission rate was 1 Gbps at an environmental temperature ranging from −40° C. to 125° C. At an environmental temperature of 100° C., vehicle-mounted optical communication system 1 was reliable for 5000 hours (it took 5000 hours before the intensity of light dropped 20%).

Figure 5:
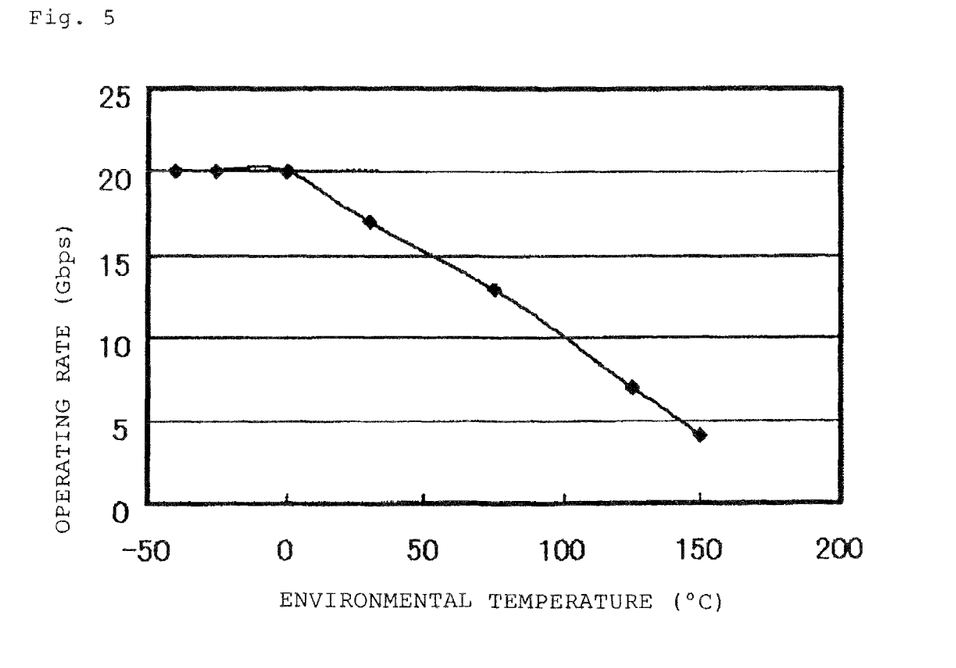
FIG. 5 is a graph showing the temperature dependency of a modulating operation of a surface-emitting laser incorporated in the optical communication system according to the first exemplary embodiment.

An experiment was conducted about the temperature dependency of a modulating operation of surface-emitting laser 15 incorporated in optical communication system 1.

The results are shown in FIG. 5. It can be confirmed that surface-emitting laser 15 could operate at a high rate of 4 Gbps at a high temperature of 150° C.

According to the present exemplary embodiment, active layer 154 of surface-emitting laser 15 includes a quantum well layer of $In_xGa_{1-x}As$ ($0.15 \leq x \leq 0.35$), and surface-emitting laser 15 has an oscillation wavelength ranging from 1000 nm to 1100 nm inclusive. Surface-emitting laser 15 thus constructed is highly reliable in severe temperature environments. Optical communication system 1 which incorporates surface-emitting laser 15 is thus highly reliable.

According to the present exemplary embodiment, surface-emitting laser 15 and drive circuit 16 are accommodated in package 17, and package 17 is with an electrically insulative liquid or gel. The liquid or gel in package 17 is capable of absorbing vibrations in the vehicle.

According to the present exemplary embodiment, the liquid or gel in package 17 comprises a silicone-base liquid or gel. Since the silicone-base liquid or gel is of excellent thermal conductivity, it can quickly dissipate the heat generated by active layer 154 of surface-emitting laser 15, thereby reliably preventing surface-emitting laser 15 from being deteriorated.

Inasmuch as the silicone-base liquid or gel has a refractive index greater than 1, the light emitted from surface-emitting laser 15 travels straight in package 17 without being spread, reducing any coupling loss between package 17 and the optical fiber of transfer medium 12. Specifically, the silicone-base liquid or gel in package 17 reduces the coupling loss from 2 dB, which occurs if package 17 is dispensed with, to 1 dB.

2nd Exemplary Embodiment

Figure 6:
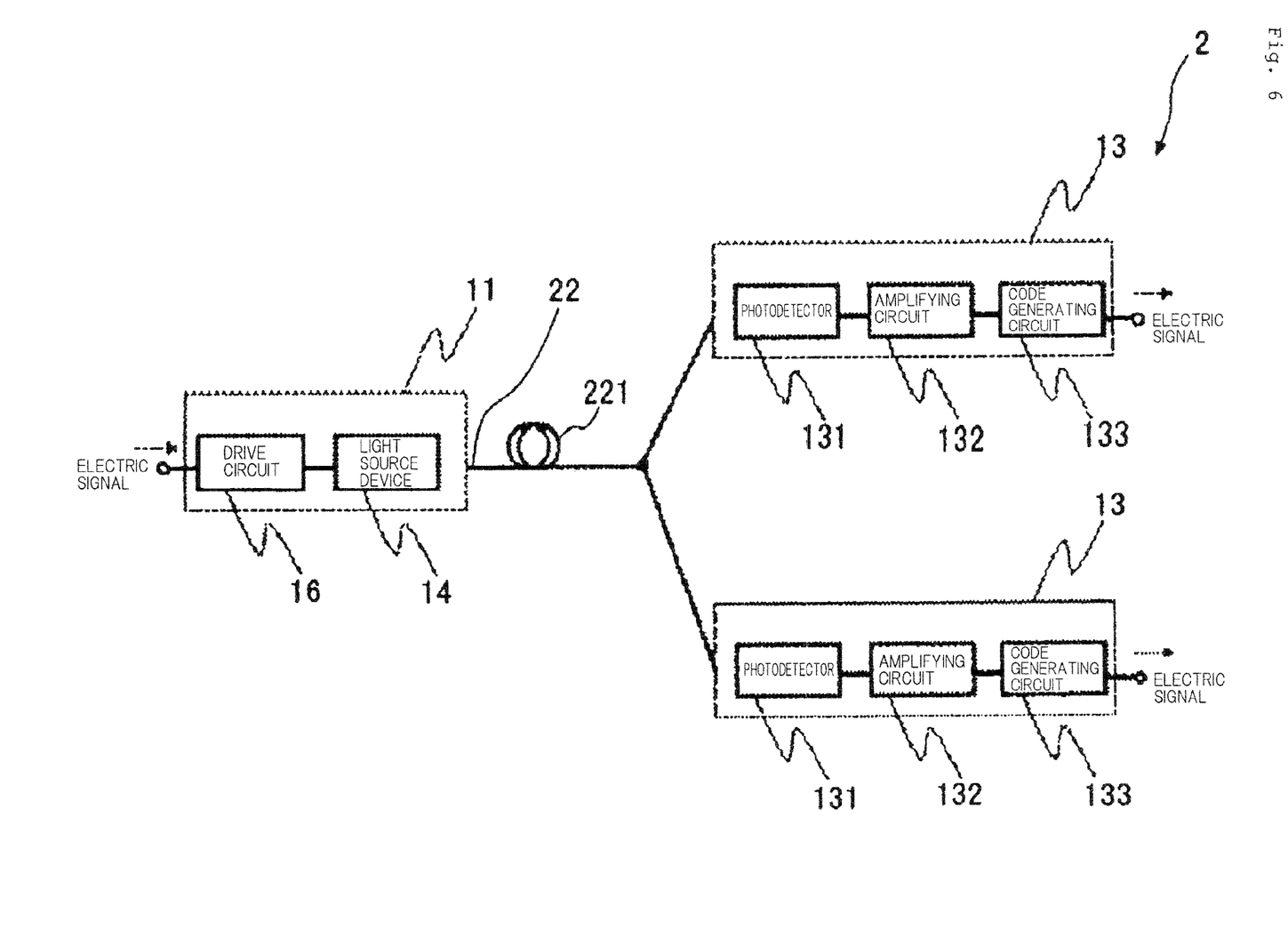
FIG. 6 is a diagram showing an optical communication system according to a second exemplary embodiment of the present invention.

A second exemplary embodiment of the present invention will be described below with reference to FIG. 6.

Optical communication system 2 according to the present exemplary embodiment includes a plurality of, e.g., two, optical receivers 13. Optical signal transmitted from optical transmitter 11 is branched and sent to each of optical receivers 13.

Transfer medium 22 comprises neodymium-doped fiber 221 for amplifying light from optical transmitter 11. The amplified optical signal is detected by each of optical receivers 13.

The present exemplary embodiment thus constructed offers the same advantages as the first exemplary embodiment.

As neodymium-doped fiber 221 amplifies light from optical transmitter 11, the intensity of the optical signal sent to each of optical receivers 13 is prevented from being lowered.

3rd Exemplary Embodiment

A third exemplary embodiment of the present invention will be described below with reference to FIG. 7.

Optical communication system 3 according to the present exemplary embodiment comprises optical transmitter 11 having light source device 14 similar to the light source devices according to the above exemplary embodiments, transfer medium 12 for transferring light from optical transmitter 11, and optical receiver 33 for receiving the light transferred by transfer medium 12. Optical communication system 3 also includes second optical transmitter 31 having a second light source, second transfer medium 32 for transferring light from second optical transmitter 31, and second optical receiver 35 for receiving the light from second transfer medium 32.

Optical communication system 3 performs data communications at a high rate of 1 Gbps or higher.

Optical transmitter 11 is incorporated in video-on-demand relay device 36.

Transfer medium 12 serves to connect video-on-demand relay device 36 and TV set 37 installed in each of the rooms of a building, and comprises an optical fiber, for example. In FIG. 7, the broken lines represent the boundaries between the rooms.

Optical receiver 33 is incorporated in TV set 37, and includes photodetector 334 (see FIG. 8), and an amplifying circuit and a code generating circuit which are similar to those according to the above exemplary embodiments. Photodetector 334 converts an optical signal into an electric signal, and the electric signal converted by photodetector 334 is decoded as it is processed by the amplifying circuit and the code generating circuit. The electric signal decoded by optical receiver 33 is displayed as an image on TV set 37.

Figure 8:
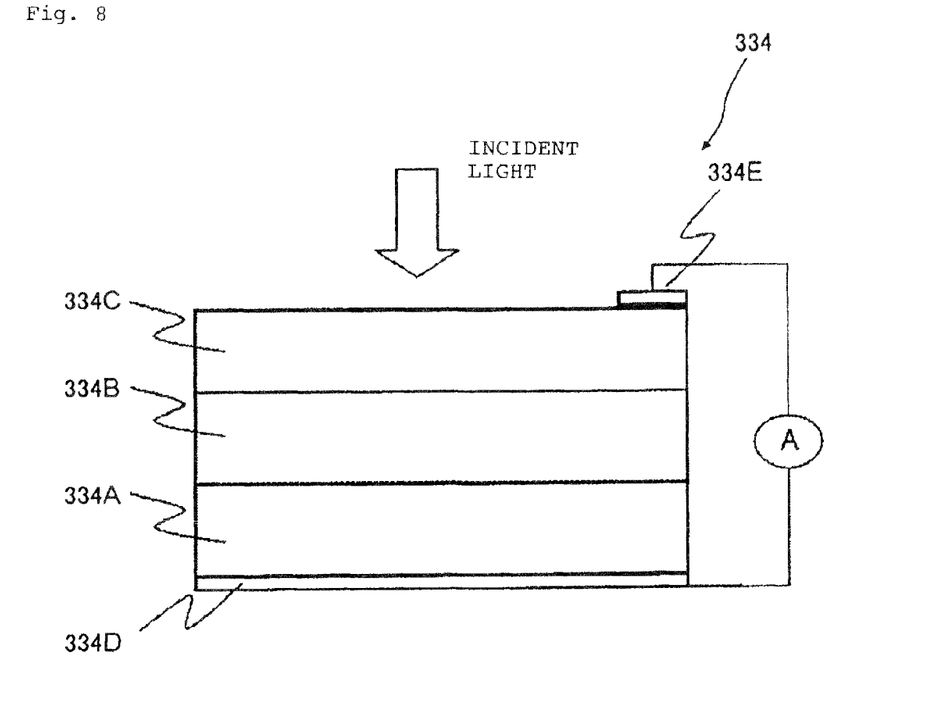
FIG. 8 is a view of a photodetector of the optical communication system according to the third exemplary embodiment.

Structural details of photodetector 334 will be described below.

Structural details of photodetector 334 are shown in FIG. 8.

Photodetector 334 is capable of detecting light having a wavelength band of 850 nm and light having a wavelength in the range from 1000 nm to 1100 nm.

Photodetector 334 comprises n-type InP substrate 334A as a semiconductor substrate, optical absorption layer 334B disposed on InP substrate 334A, and cap layer 334C disposed on optical absorption layer 334B.

A buffer layer, a multiplier layer, an electric field relaxing layer, etc. may be interposed between optical absorption layer 334B and InP substrate 334A.

Optical absorption layer 334B comprises an InGaAs layer lattice-matched to InP substrate 334A.

Cap layer 334C is made of a semiconductor material having a forbidden bandwidth of 1.46 eV or greater, e.g., InAlAs.

n-type electrode 334D is disposed on cap layer 334C.

n-type electrode 334D is disposed on the reverse surface of InP substrate 334A.

Figure 7:
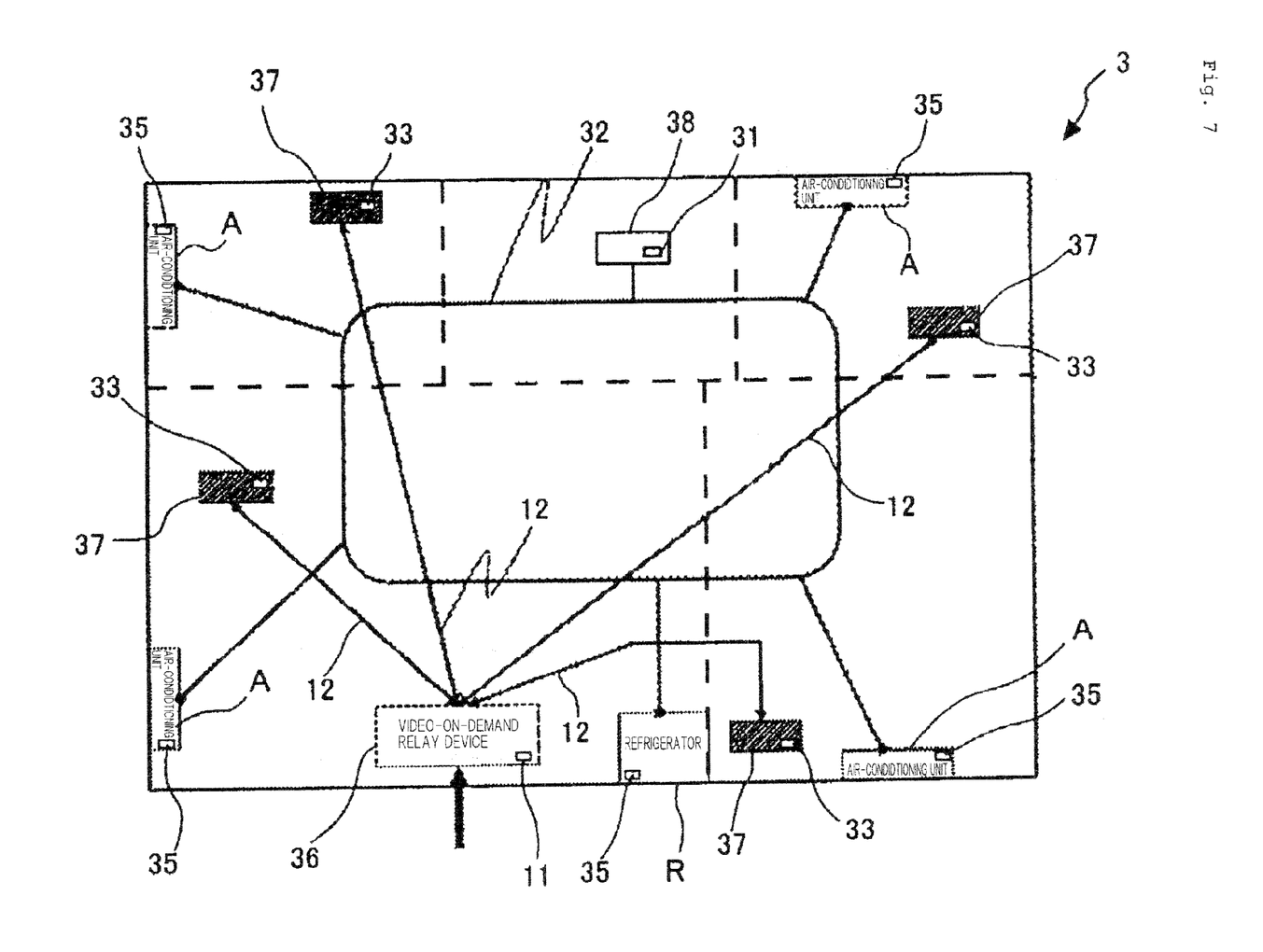
FIG. 7 is a diagram showing an optical communication system according to a third exemplary embodiment of the present invention.

As shown in FIG. 7, second optical transmitter 31 serves to transmit an optical signal in a band of 850 nm, and is incorporated in controller 38 for controlling air-conditioning units A and refrigerator R.

Second optical transmitter 31 comprises a drive circuit for receiving an electric signal generated when controller 38 is operated, and a second light source device energized by the drive circuit.

Figure 9:
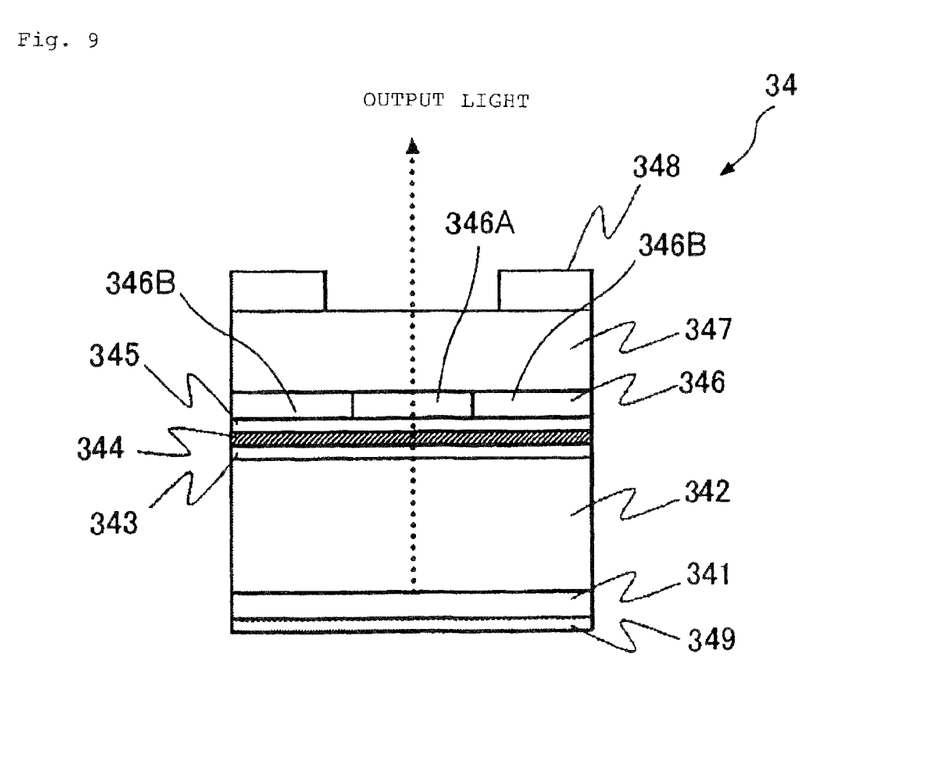
FIG. 9 is a view of a surface-emitting laser incorporated in the vehicle-mounted optical communication system according to the third exemplary embodiment.

The second light source device comprises surface-emitting laser 34 shown in FIG. 9.

Surface-emitting laser 34 comprises GaAs substrate 341 as a semiconductor substrate, first DBR (Distributed Bragg Reflector) layer 342 disposed on GaAs substrate 341, lower cladding layer 343 disposed on first DBR layer 342, active layer 344 disposed on lower cladding layer 343, upper cladding layer 345 disposed on active layer 344, current constricting layer 346 disposed on upper cladding layer 345, and second DBR (Distributed Bragg Reflector) layer 347 disposed on current constricting layer 346.

First DBR layer 342 is an n-type semiconductor multilayer film comprising an alternate stack of Al0.1Ga0.9As and Al0.9Ga0.1As films.

Lower cladding layer 343 comprises an AlGaAs layer, for example.

Active layer 344 is an MQW (Multiple Quantum Well) layer comprising an alternate stack of quantum well layers of GaAs and AlGaAs barrier layers.

Upper cladding layer 345 comprises an AlGaAs layer, for example.

Current constricting layer 346 comprises an AlAs layer. Current constricting layer 346 includes low-resistance region 346A. Low-resistance region 346A is sandwiched between high-resistance regions (oxide regions) 346B having a higher resistance value than low-resistance region 346A and formed by a steam oxidation process.

Second DBR layer 347 is a p-type semiconductor multilayer film comprising an alternate stack of Al0.1Ga0.9As and Al0.9Ga0.1As films.

p-type electrode 348 is disposed on second DBR layer 347, and n-type electrode 349 is disposed on the reverse side of GaAs substrate 341.

Surface-emitting laser 34 has an oscillation wavelength band of 850 nm. Though not shown, surface-emitting laser 34 is housed in a package filled with an electrically insulative liquid or gel, as with surface-emitting laser 15.

As shown in FIG. 7, second transfer medium 32 comprises an optical fiber for transferring light from second optical transmitter 31, and interconnects controller 38 and air-conditioning units A and refrigerator R that are installed in the building. Second transfer medium 32 comprises a ring-shaped optical fiber and a linear optical fiber connected to the ring-shaped optical fiber.

Second optical receiver 35 is installed in each of air-conditioning units A and refrigerator R that are connected to second transfer medium 32. Second optical receiver 35 comprises photodetector 334, an amplifying circuit, and a code generating circuit which are similar to those of optical receiver 33.

Photodetector 334 converts an optical signal into an electric signal, and the electric signal converted by photodetector 334 is decoded as it is processed by the amplifying circuit and the code generating circuit. The electric signal decoded by second optical receiver 35 is used to control the operation of air-conditioning units A and refrigerator R.

It was confirmed that optical communication system 3 according to the present exemplary embodiment had a transmission rate of 1 Gbps at an environmental temperature ranging from −40° C. to 125° C.

Optical communication system 3 was reliable for 5000 hours at the environmental operating temperature of 100° C. of surface-emitting laser 15 (at this time, the environmental temperature of surface-emitting laser 34 was 50° C.).

Optical communication system 3 has the same advantages as with the first exemplary embodiment, and also offers the following advantages:

For indoor information communications, there are needs for transmitting a large amount of information such as images and also needs for transmitting a small amount of information for use in controlling air-conditioning units A and refrigerator R, etc. If these types of information are transmitted in the same wavelength band, then, depending on the amount of information, the transfer of the information may be delayed.

According to the present exemplary embodiment, image information is converted by surface-emitting laser 15 into an optical signal at a wavelength ranging from 1000 nm to 1100 nm, and a small amount of information such as control information is converted by surface-emitting laser 34 into an optical signal in a wavelength band of 850 nm.

Since different wavelength bands are used depending on the amount of information, the transfer of information is prevented from being delayed.

According to the present exemplary embodiment, furthermore, a photodetector is capable of detecting both light in a wavelength band of 850 nm and light at a wavelength ranging from 1000 nm to 1100 nm. Therefore, the cost is smaller than if photodetectors for detecting respective lights at those wavelengths are installed.

4th Exemplary Embodiment

Figure 10:
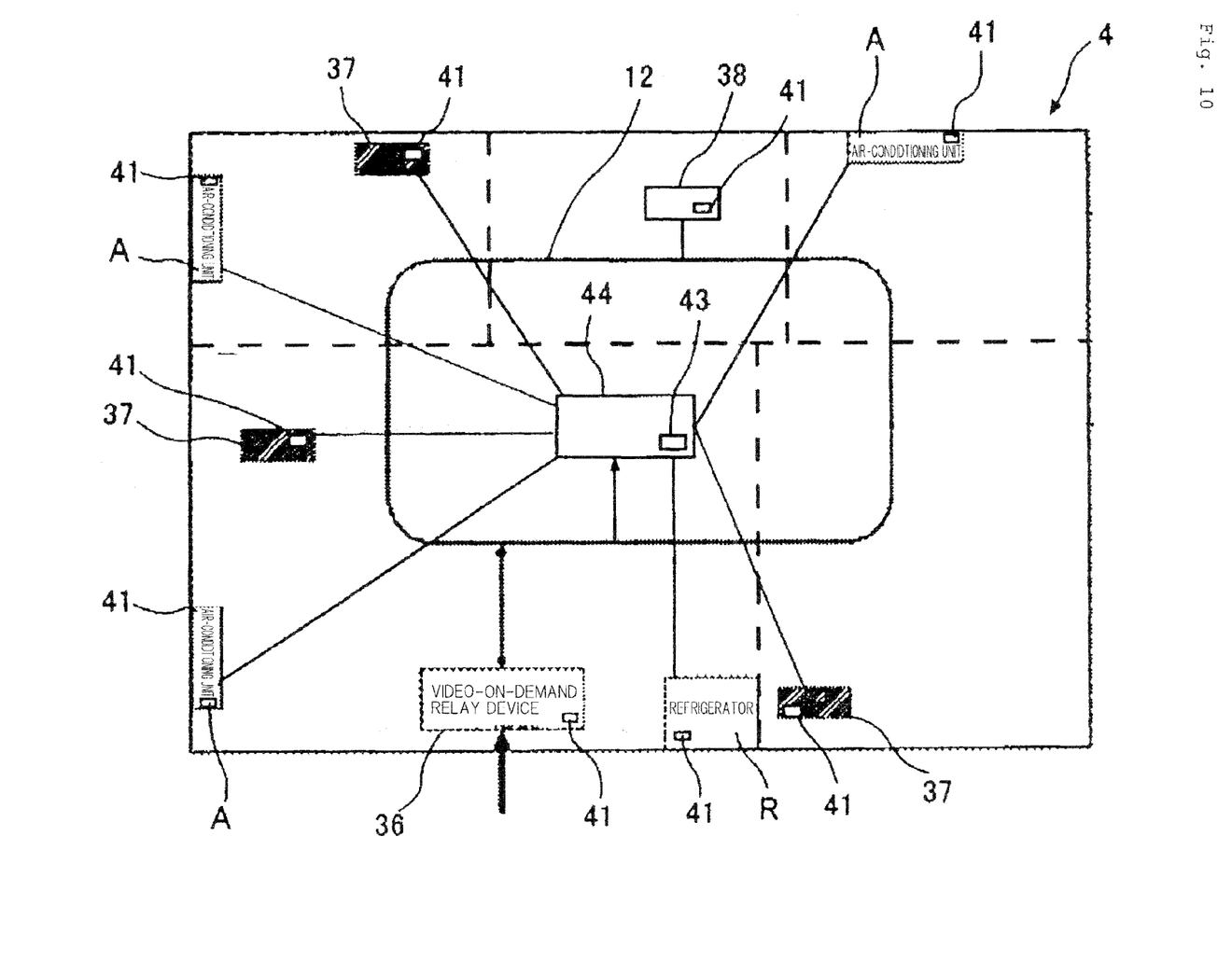
FIG. 10 is a diagram showing an optical communication system according to a fourth exemplary embodiment of the present invention.

A fourth exemplary embodiment of the present invention will be described below with reference to FIG. 10.

Optical communication system 4 according to the present exemplary embodiment comprises optical transmitter 41 having surface-emitting laser 15 and surface-emitting laser 34 similar to those according to the third exemplary embodiment, transfer medium 12 for transferring light from optical transmitter 41, and optical receiver 43 for receiving the light transferred by transfer medium 12.

Optical transmitter 41 includes a drive circuit similar to the drive circuits according to the above exemplary embodiments. The drive circuit serves to energize surface-emitting laser 15 and surface-emitting laser 34. Surface-emitter lasers 15, 34 housed in a package filled with an electrically insulative liquid or gel, as with the above exemplary embodiments.

Optical transmitter 41 is installed in each of video-on-demand relay device 36 and controller 38.

In video-on-demand relay device 36, controller 38, etc., image data and control signals are divided by a data divider, not shown, and the divided data are converted into packets with various ancillary information (data name, source and destination addresses, transmission time, etc.) added as a transmission header to each of the data. The packetized data are send as an electric signal to the drive circuit of optical transmitter 41. The drive circuit energizes surface-emitting laser 15 and surface-emitting laser 34. Surface-emitting laser 34 generates an optical signal corresponding to the transmission header, and surface-emitting laser 15 generates an optical signal corresponding to the data itself. The optical signal corresponding to the transmission header and the optical signal corresponding to the data itself are transferred in synchronism with each other. The optical signal corresponding to the data itself can be transferred at a rate ranging from 1 Gbps to 5 Gbps.

Transfer medium 12 comprises a ring-shaped optical fiber and a linear optical fiber connected to the ring-shaped optical fiber. To the ring-shaped optical fiber, there are connected video-on-demand relay device 36, controller 38, and switching controller 44 through the linear optical fiber.

Switching controller 44 serves to control destinations of optical signals from devices 36, 38. Switching controller 44 includes optical receiver 43.

Figure 11:
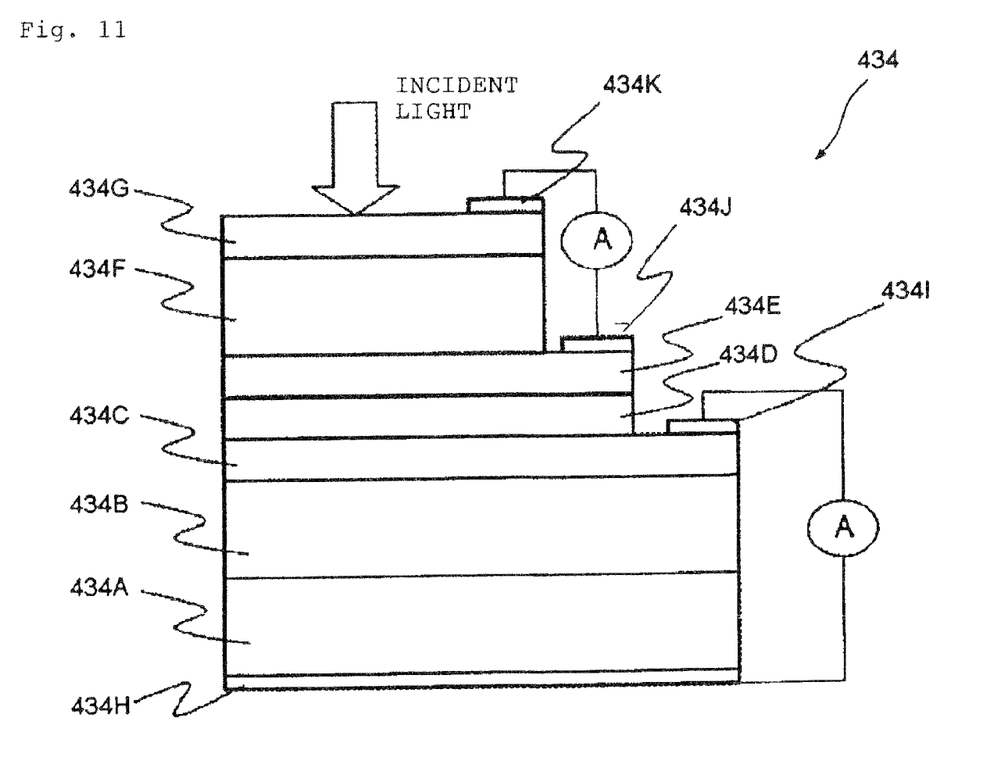
FIG. 11 is a view of a photodetector of the optical communication system according to the fourth exemplary embodiment.

Optical receiver 43 comprises photodetector 434 shown in FIG. 11, and an amplifying circuit and a code generating circuit, not shown, similar to those according to the above exemplary embodiments.

Photodetector 434 comprises n-type InP substrate 434A as a semiconductor substrate, optical absorption layer 434B disposed on InP substrate 434A, cap layer 434C disposed on optical absorption layer 434B, insulating layer 434D disposed on cap layer 434C, n-type in P layer 434E as a semiconductor layer disposed on insulating layer 434D, optical absorption layer 434F disposed on InP layer 434E, and cap layer 434G disposed on optical absorption layer 434F.

n-type electrode 434H is disposed on the reverse surface of InP substrate 434A.

Optical absorption layer 434B comprises an InGaAs layer lattice-matched to InP substrate 434A.

Cap layer 434C is made of a semiconductor material having a forbidden bandwidth of 1.46 eV or greater, e.g., p-type InP.

Insulating layer 434D comprises an Ru-doped InP layer, for example.

Optical absorption layer 434F is made of a semiconductor material having a forbidden bandwidth greater than 1.15 eV, e.g., InAlGaAs. Cap layer 434G is made of a semiconductor material having a forbidden bandwidth greater than 1.49 eV, e.g., p-type InAlAs. p-type electrode 434K is disposed on cap layer 434G.

Optical absorption layer 434B is disposed so as to fully cover substantially the entire surface of InP substrate 434A, and cap layer 434C is also disposed so as to fully cover substantially the entire surface of optical absorption layer 434B.

Insulating layer 434D and InP layer 434E are smaller in planar configuration than cap layer 4340, and n-type electrode 434I is disposed on an area of cap layer 434C which is not covered with insulating layer 434D and InP layer 434E.

Optical absorption layer 434F and cap layer 434G are smaller in planar configuration than InP layer 434E, and n-type electrode 434J is disposed on an area of InP layer 434E which is not covered with optical absorption layer 434F and cap layer 434G.

With photodetector 434 thus constructed, optical absorption layer 434B is capable of absorbing light at a wavelength ranging from 1000 to 1100 nm, and optical absorption layer 434F is capable of absorbing light in a wavelength band of 850 nm.

An optical signal emitted from optical transmitter 41 includes an optical signal in a wavelength band of 850 nm which corresponds to a transmission header and an optical signal at a wavelength ranging from 1000 to 1100 nm which corresponds to data itself. Photodetector 434 can thus separately detect the optical signal in a wavelength band of 850 nm and the optical signal at a wavelength ranging from 1000 to 1100 nm. The separate optical signals are converted into respective electric signals, which are decoded as they are processed by the amplifying circuit and the code generating circuit.

Switching controller 44 analyzes the electric signal corresponding to the transmission header to determine which of TV set 37, air-conditioning units A, and refrigerator R the electric signal corresponding to the data itself is to be transferred to.

The electric signal is sent to TV set 37, air-conditioning units A, or refrigerator R through switching controller 44 to control the operation of TV set 37, air-conditioning units A, or refrigerator R.

The present exemplary embodiment has the same advantages as with the above exemplary embodiments, and also offers the following advantages:

According to the present exemplary embodiment, optical transmitter 41 generates an optical signal in a wavelength band of 850 nm which corresponds to a transmission header and an optical signal at a wavelength ranging from 1000 to 1100 nm which corresponds to data itself. Since the transmission header is of a low volume and can be transmitted at a low rate, surface-emitting laser 24 is less liable to be heated and is kept reliable.

The data itself is of a high volume and needs to be transmitted promptly. Since surface-emitting laser 15, which is of high heat resistance, for generating an optical signal at a wavelength ranging from 1000 to 1100 nm is used to transmit the data itself, optical communication system 4 is kept reliable.

According to the present exemplary embodiment, photodetector 434 comprises optical absorption layer 434F made of a semiconductor material having a forbidden bandwidth greater than 1.15 eV and optical absorption layer 434B comprising an InGaAs layer. Therefore, photodetector 434 can separately detect an optical signal in a wavelength band of 850 nm and an optical signal at a wavelength ranging from 1000 to 1100 nm. Consequently, single photodetector 434 can separate optical signals in a plurality of wavelength bands for decoding the optical signals individually.

The present invention is not limited to the above exemplary embodiments, but covers modifications, improvements, etc. insofar as they can achieve the object of the present invention.

For example, though surface-emitting lasers 15, 34 are accommodated in package 17 in the above exemplary embodiments, the present invention is not limited to such a structure. Surface-emitting lasers 15, 34 may not be accommodated in package 17. Not only surface-emitting lasers 15, 34 but also the photodetector of the optical receiver may be accommodated in package 17 filled with an electrically insulative liquid or gel. The electrically insulative liquid or gel in package 17 reduces the coupling loss from 2 dB, which occurs if the surface-emitting laser and the photodetector are not housed in package 17, to 1 dB.

In the third exemplary embodiment and the fourth exemplary embodiment, the optical communication system includes transfer medium 12. However, the optical communication system may include transfer medium 22 comprising neodymium-doped fiber 221 similar to the neodymium-doped fiber according to the second exemplary embodiment.

In the third exemplary embodiment, photodetector 334 including single optical absorption layer 334B for detecting an optical signal in a wavelength band of 850 nm and an optical signal at a wavelength ranging from 1000 to 1100 nm is employed. However, photodetector 434 according to the fourth exemplary embodiment may be employed.

In the fourth exemplary embodiment, after switching controller 44 converts an optical signal into an electric signal, switching controller 44 sends the electric signal to TV set 37, air-conditioning units A, or refrigerator R. Alternatively, the switching controller may send an optical signal to TV set 37, air-conditioning units A, or refrigerator R.

Specifically, the switching controller separates an optical signal sent from optical transmitter 41 into an optical signal corresponding to a transmission header and an optical signal corresponding to data itself. The switching controller converts the optical signal corresponding to a transmission header into an electric signal with a photodetector. Thereafter, the controller sends the optical signal corresponding to data itself to the monitor or the front monitor based on the electric signal corresponding to a transmission header. Unlike the fourth exemplary embodiment, the switching controller may have only a photodetector for detecting an optical signal corresponding to a transmission header (an optical signal in a wavelength band of 850 nm). TV set 37, air-conditioning units A, or refrigerator R may have only a photodetector for detecting an optical signal corresponding to data itself (an optical signal at a wavelength in the range from 1000 to 1100 nm).

Since data can be sent as an optical signal between the switching controller and TV set 37 or between the switching controller and refrigerator R or between the switching controller and air-conditioning units A, the transmission rate for data between the switching controller and TV set 37 or between the switching controller and refrigerator R or between the switching controller and air-conditioning units A is increased.

In the third exemplary embodiment and the fourth exemplary embodiment, controller 38 and video-on-demand relay device 36 incorporate optical transmitters. However, the controller and the video-on-demand relay device may incorporate optical receivers. TV set 37, air-conditioning units A, and refrigerator R may incorporate optical receivers for allowing signals to be transferred bidirectionally.

The invention claimed is:

1. An optical communication system for performing data transmission with optical signals, comprising:
    a first optical transmitter including a first surface-emitting laser, for transmitting an optical signal generated by said first surface-emitting laser, said first surface-emitting laser including an active layer of a multiple quantum well structure having a quantum well layer of $In_xGa_{1-x}As$ ($0.15 \leq x \leq 0.35$), said first surface-emitting laser having an oscillation wavelength ranging from 1000 nm to 1100 nm inclusive; and
    a first optical receiver connected to said first optical transmitter by a first optical transfer path, for receiving said optical signal transmitted from said first optical transmitter through said first optical transfer path,
    wherein said first optical transmitter further includes a second surface-emitting laser having an oscillation wavelength band of 850 nm, for transmitting an optical signal generated by said second surface-emitting laser, and
    said first surface-emitting laser generates an optical signal representing data itself and said second surface-emitting laser generates an optical signal representing a transmission header.

2. An optical communication system for performing data transmission with optical signals, comprising:
    a first optical transmitter including a first surface-emitting laser, for transmitting an optical signal generated by said first surface-emitting laser, said first surface-emitting laser including an active layer of a multiple quantum well structure having a quantum well layer of InxGa1-xAs ($0.15 \leq x \leq 0.35$), said first surface-emitting laser having an oscillation wavelength ranging from 1000 nm to 1100 nm inclusive; and
    a first optical receiver connected to said first optical transmitter by a first optical transfer path, for receiving said optical signal transmitted from said first optical transmitter through said first optical transfer path,
    wherein said first optical transmitter further includes a second surface-emitting laser having an oscillation wavelength band of 850 nm, for transmitting an optical signal generated by said second surface-emitting laser, and
    said first optical receiver includes a photodetector comprising an optical absorption layer which comprises an InGaAs layer disposed on a semiconductor substrate and a cap layer disposed on said optical absorption layer and having a forbidden bandwidth of 1.46 eV or greater, and said optical receiver receives both the optical signal generated by said first surface-emitting laser and the optical signal generated by said second surface-emitting laser.

3. An optical communication system for performing data transmission with optical signals, comprising:
    a first optical transmitter including a first surface-emitting laser, for transmitting an optical signal generated by said first surface-emitting laser, said first surface-emitting laser including an active layer of a multiple quantum well structure having a quantum well layer of InxGa1-xAs ($0.15 \leq x \leq 0.35$), said first surface-emitting laser having an oscillation wavelength ranging from 1000 nm to 1100 nm inclusive; and
    a first optical receiver connected to said first optical transmitter by a first optical transfer path, for receiving said optical signal transmitted from said first optical transmitter through said first optical transfer path,
    wherein said first optical transmitter further includes a second surface-emitting laser having an oscillation wavelength band of 850 nm, for transmitting an optical signal generated by said second surface-emitting laser, and
    said first optical receiver includes a photodetector comprising a first optical absorption layer which comprises an InGaAs layer disposed on a semiconductor substrate, a first cap layer disposed on said optical absorption layer and having a forbidden bandwidth of 1.46 eV or greater, an insulating layer disposed on said cap layer, a semiconductor layer disposed on said insulating layer, a second optical absorption layer disposed on said semiconductor layer and having a forbidden bandwidth of 1.15 eV or greater, and a second cap layer disposed on said second optical absorption layer and having a forbidden bandwidth of 1.46 eV or greater, and said optical receiver receives both the optical signal generated by said first surface-emitting laser and the optical signal generated by said second surface-emitting laser.

4. The optical communication system according to claim 1, further comprising:
    a second optical transmitter including a second surface-emitting laser having an oscillation wavelength band of 850 nm, for transmitting an optical signal generated by said second surface-emitting laser; and
    a second optical receiver for receiving said optical signal transmitted from said second optical transmitter.

5. The optical communication system according to claim 1, wherein at least said first surface-emitting laser is housed in a sealed package which is filled with an electrically insulative liquid or gel.

6. The optical communication system according to claim 1, wherein said first optical transmitter and said second optical receiver are equipped in a user's house.

7. The optical communication system according to claim 1, wherein said optical transfer path for transferring said optical signal comprises a neodymium-doped optical fiber.

8. An optical transmitter for use in an optical communication system for performing data transmission with optical signals, comprising:
    a first light source device including a first surface-emitting laser, for transmitting an optical signal generated by said first surface-emitting laser, said first surface-emitting laser including an active layer of a multiple quantum well structure having a quantum well layer of $In_xGa_{1-x}As$ ($0.15 \leq x \leq 0.35$), said first surface-emitting laser having an oscillation wavelength ranging from 1000 nm to 1100 nm inclusive;

a drive circuit for energizing said first surface-emitting laser of said first light source device based on an electric signal; and a second light source device including a second surface-emitting laser having an oscillation wavelength band of 850 nm, for transmitting an optical signal generated by said second surface-emitting laser, wherein said first surface-emitting laser generates an optical signal representing data itself and said second surface-emitting laser generates an optical signal representing a transmission header.

9. The optical transmitter according to claim 8, wherein at least said first surface-emitting laser is housed in a sealed package which is filled with an electrically insulative liquid or gel.

* * * * *